US012735800B2

(12) United States Patent
Deng et al.

(10) Patent No.: US 12,735,800 B2
(45) Date of Patent: Sep. 15, 2026

(54) SYNTHESIS OF SINGLE-CRYSTAL NICKEL-RICH CATHODE MATERIALS USING FLAME-ASSISTED SPRAY PYROLYSIS

(71) Applicant: Massachusetts Institute of Technology, Cambridge, MA (US)

(72) Inventors: Sili Deng, Newton, MA (US); Jianan Zhang, Cambridge, MA (US); Valerie L. Muldoon, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 18/843,937

(22) PCT Filed: Mar. 1, 2023

(86) PCT No.: PCT/US2023/063447
§ 371 (c)(1),
(2) Date: Sep. 4, 2024

(87) PCT Pub. No.: WO2023/172830
PCT Pub. Date: Sep. 14, 2023

(65) Prior Publication Data

US 2025/0215608 A1 Jul. 3, 2025

Related U.S. Application Data

(60) Provisional application No. 63/317,134, filed on Mar. 7, 2022.

(51) Int. Cl.
*C30B 1/02* (2006.01)
*C01G 1/02* (2006.01)
(Continued)

(52) U.S. Cl.
CPC .................. *C30B 1/02* (2013.01); *C01G 1/02* (2013.01); *C01G 53/50* (2013.01); *C30B 29/22* (2013.01);
(Continued)

(58) Field of Classification Search
CPC .................................. C01G 1/02; C01G 53/50
See application file for complete search history.

(56) References Cited

U.S. PATENT DOCUMENTS 9,748,567 B2 * 8/2017 Elhassid ................ C01G 53/50
10,384,940 B2 * 8/2019 Katusic .................... C01G 1/02
(Continued)

FOREIGN PATENT DOCUMENTS

CN 112479266 A 3/2021
CN 114212834 A * 3/2022 ............ H01M 4/505
(Continued)

OTHER PUBLICATIONS

Machine translation of CN 114212834 (no date) (Year: 0000).*
(Continued)

*Primary Examiner* — Amanda C. Walke
(74) *Attorney, Agent, or Firm* — Foley Hoag LLP; Dana M. Gordon; Tesia V. Chciuk

(57) ABSTRACT

A method of synthesis of single crystal nickel-rich cathode materials can include preparing a precursor solution by dissolving lithium nitrate, nickel nitrate, manganese nitrate, and cobalt nitrate in water, aerosolizing the solution of a) in a stream of air using an ultrasonic sprayer, preheating the resulting droplets, premixing the droplets with methane, decomposing the droplets by passing through a co-flow burner, depositing solid particles on a filter, and calcinating the solid particles in a furnace in oxygen to produce a single crystal cathode material.

19 Claims, 5 Drawing Sheets

(51) Int. Cl.

| | |
|---|---|
| ***C01G 53/50*** | (2025.01) |
| ***C30B 29/22*** | (2006.01) |
| ***H01M 4/505*** | (2010.01) |
| ***H01M 4/525*** | (2010.01) |
| *H01M 4/02* | (2006.01) |

(52) U.S. Cl.

CPC .......... *H01M 4/505* (2013.01); *H01M 4/525* (2013.01); *H01M 2004/021* (2013.01)

(56) References Cited

U.S. PATENT DOCUMENTS

| | | | | |
|---|---|---|---|---|
| 11,434,146 | B2 * | 9/2022 | Kress | C01B 13/34 |
| 2013/0045158 | A1 * | 2/2013 | Katusic | C01G 51/42 423/594.15 |
| 2017/0275166 | A1 * | 9/2017 | Katusic | C01G 51/04 |
| 2023/0278888 | A1 * | 9/2023 | Deng | C01G 53/50 429/223 |
| 2025/0002371 | A1 * | 1/2025 | Belharouak | C01G 53/04 |

FOREIGN PATENT DOCUMENTS

| | | | | |
|---|---|---|---|---|
| KR | 20190020992 | A * | 3/2019 | C01G 53/50 |
| WO | WO-2014159118 | A1 | 10/2014 | |
| WO | WO-2019020724 | A1 | 1/2019 | |
| WO | WO-2020185931 | A1 | 9/2020 | |
| WO | WO-2023/172828 | A1 | 9/2023 | |
| WO | WO-2023/172830 | A2 | 9/2023 | |

OTHER PUBLICATIONS

Machine translation of KR 2019/0020992 (no date) (Year: 0000).*

Gao et al., "High-quality LiNi0.8Co0.15Al0.05O2 cathode with excellent structural stability: Suppressed structural degradation and pore defects generation", Nano Energy, vol. 73, Apr. 15, 2020, p. 104798.

International Search Report and Written Opinion for International Application No. PCT/US23/63438 dated Jul. 20, 2023.

Li et al., "Spray pyrolysis synthesis of nickel-rich layered cathodes LiNi1?2xCoxMnxO2 (x=0.075, 0.05, 0.025) for lithium-ion batteries", Journal of Energy Chemistry, vol. 27, No. 2, Mar. 1, 2018, pp. 447-450.

Zhang et al., "Accelerated synthesis of Li(Ni0.8Co0.1Mn0.1)O2 cathode materials using flame-assisted spray pyrolysis and additives", Journal of Power Sources, vol. 528, Mar. 2, 2022, p. 231244.

International Search Report and Written Opinion for International Application No. PCT/US23/63447 dated Sep. 8, 2023.

Julien et al., "NCA, NCM811, and the Route to Ni-Richer Lithium-Ion Batteries", Energies, vol. 13, Dec. 2, 2020. Retrieved from the Internet: <URL: https://www.mdpi.com/1996-1073/13>.

Lu et al., "Single-Crystal Nickel-Based Cathodes: Fundamentals and Recent Advances", Electrochemical Energy Reviews, vol. 5, Sep. 26, 2022. Retrieved from the Internet: <URL: https://doi.org/10.1007/s41918-022-00166-2>.

Wang et al., "Grain size regulation for balancing cycle performance and rate capability of LiNi0.9Co0.055Mn0.045O2 single crystal nickel-rich cathode materials", Journal of Energy Chemistry, vol. 65, Jun. 19, 2021. Retrieved from the Internet: <URL: https://www.sciencedirect.com/science/article/abs/pii/S2095495621003600>.

* cited by examiner

SYNTHESIS OF SINGLE-CRYSTAL NICKEL-RICH CATHODE MATERIALS USING FLAME-ASSISTED SPRAY PYROLYSIS

CLAIM OF PRIORITY

This application is a U.S. § 371 National Stage of International Application No. PCT/US23/063447, filed Mar. 1, 2023; which claims the benefit of priority to U.S. Provisional Patent Application No. 63/317,134, filed Mar. 7, 2022; each of which is incorporated herein by reference in its entirety.

FIELD OF THE INVENTION

The invention relates to synthesis of materials using flame-assisted spray pyrolysis.

BACKGROUND

Nickel-rich cathode materials are one of the promising candidates for high energy density lithium-ion batteries. Generally, cathode materials with increased nickel content are desired for boosting the capacity. Nevertheless, many issues are also associated with the high nickel content, including fast capacity fading and low thermal stability (Ref. 1), which are related to the polycrystalline structure of current cathode materials. For instance, polycrystalline particles experience severe shape change after extensive cycling, causing microcracks and serious side reactions. Many strategies have been developed to mitigate the issue, such as doping, coating, and using single-crystal (SC) material. Compared with other methods, preparing SC materials is a promising technique due to its high potential for increasing the cycling performance and ensuring high operating voltage (Ref 2). However, the biggest barrier to the practical application of SC is the high manufacturing cost.

SUMMARY

This Summary introduces a selection of concepts in simplified form that are described further below in the Description. This Summary neither identifies key or essential features, nor limits the scope, of the claimed subject matter.

In one aspect, a method of synthesis of nickel-rich cathode materials can include preparing a precursor solution by dissolving lithium nitrate, nickel nitrate, manganese nitrate, and cobalt nitrate in water, aerosolizing the precursor solution in a stream of air using an ultrasonic sprayer to form droplets, preheating the droplets, generating a premixed methane flame in a burner, decomposing the droplets by passing through the burner, depositing solid particles on a powder collector, and calcinating the solid particles in a furnace in the presence of an oxidizing agent to produce a single crystal cathode material of a controllable size and crystal structure by controlling the calcination time and calcination temperature.

In another aspect, a method of synthesis of a single crystal nickel-rich cathode material can include forming droplets of a precursor solution including a nickel salt in a stream of air, preheating the droplets, generating a flame in a burner, decomposing the droplets by passing through the burner, and calcinating the solid particles in a furnace in the presence of an oxidizing agent at a calcination temperature and for a calcination time to control the size and crystal structure of the single crystal nickel-rich cathode material.

In another aspect, a single crystal nickel-rich cathode material can include spherical lithium-nickel-cobalt-manganese oxide particles substantially free of hollow particles, broken particles and particles with holes on a surface of the particles.

In certain circumstances, the method can include adding excess lithium salt to the precursor solution.

In certain circumstances, the nickel-rich cathode material can include lithium-nickel-cobalt-manganese oxide (NCM).

In certain circumstances, the nickel nitrate of the precursor solution can be nickel nitrate hexahydrate ($Ni(NO_3)_2 \cdot 6H_2O$).

In certain circumstances, the manganese nitrate of the precursor solution can be manganese nitrate tetrahydrate ($Mn(NO_3)_2 \cdot 4H_2O$).

In certain circumstances, the cobalt nitrate of the precursor solution can be cobalt nitrate hexahydrate ($Co(NO_3)_2 \cdot 6H_2O$).

In certain circumstances, the precursor solution can include urea. In certain circumstances, the calcination temperature can be between 750° C. and 900° C. For example, the calcination temperature can be between 800° C. and 875° C.

In certain circumstances, the calcination time can be between 10 minutes and 2 hours. For example, the calcination time can be between 30 minutes and 90 minutes.

In certain circumstances, a lithium salt can be added during calcination. The lithium salt can be $LiNO_3$, LiOH, $Li_2SO_4$, $Li_2CO_3$, or mixtures thereof. The excess lithium salt can be 2%, 3%, 4%, 5%, 6%, 7%, 8%, 9%, 1, 1%, 12%, 13%, 14%, 15%, 16%, 17%, 18%, 19% or 20% excess of the mass of the final composition stoichiometry.

In certain circumstances, preheating the droplets can include exposing the droplets to a temperature of 125° C. to 325° C.

In certain circumstances, the solid particles are calcinated for up to 60 minutes at between 825° C. and 875° C.

In certain circumstances, the single crystal nickel-rich cathode material can include single crystal particles having an average size of between 0.5 microns and 5 microns. For example, the single crystal nickel-rich cathode material can include single crystal particles having an average size of between 1 microns and 3 microns.

In certain circumstances, the single crystal nickel-rich cathode material can include spherical particles.

In certain circumstances, the nickel-rich cathode material can include $LiNi_{0.8}Co_{0.1}Mn_{0.1}O_2$ (NCM811) or $LiNi_{0.6}Co_{0.2}Mn_{0.2}O_2$(NCM822).

In certain circumstances, the nickel-rich cathode material can have a discharge capacity of greater than 190 mAh/g (1st cycle at 0.1 C).

In certain circumstances, the nickel-rich cathode material can have a capacity retention of greater than 85%.

In certain circumstances, the droplets can be passed through a preheating zone at a flow rate of between 5 L/min and 20 L/min, for example, at a flow rate of about 10 L/min.

In certain circumstances, the solid particles can be calcinated in a tube furnace.

In certain circumstances, the nickel-rich cathode material can include an ordered layered structure.

In certain circumstances, the method can include a liquid-feed flame assisted spray pyrolysis (FASP) method.

In certain circumstances, the method can be a continuous-flow process.

In certain circumstances, the ultrasonic sprayer can be a 1.7 MHz ultrasonic sprayer.

In certain circumstances, the preheating of the aerosolized droplets can include heating by passage through two low-temperature preheating sections.

In certain circumstances, the depositing solid particles on a filter can include depositing the solid particles on a glass-fiber filter.

The following Description references the accompanying drawings which form a part this application, and which show, by way of illustration, specific example implementations. Other implementations may be made without departing from the scope of the disclosure.

DESCRIPTION

Figure 1:
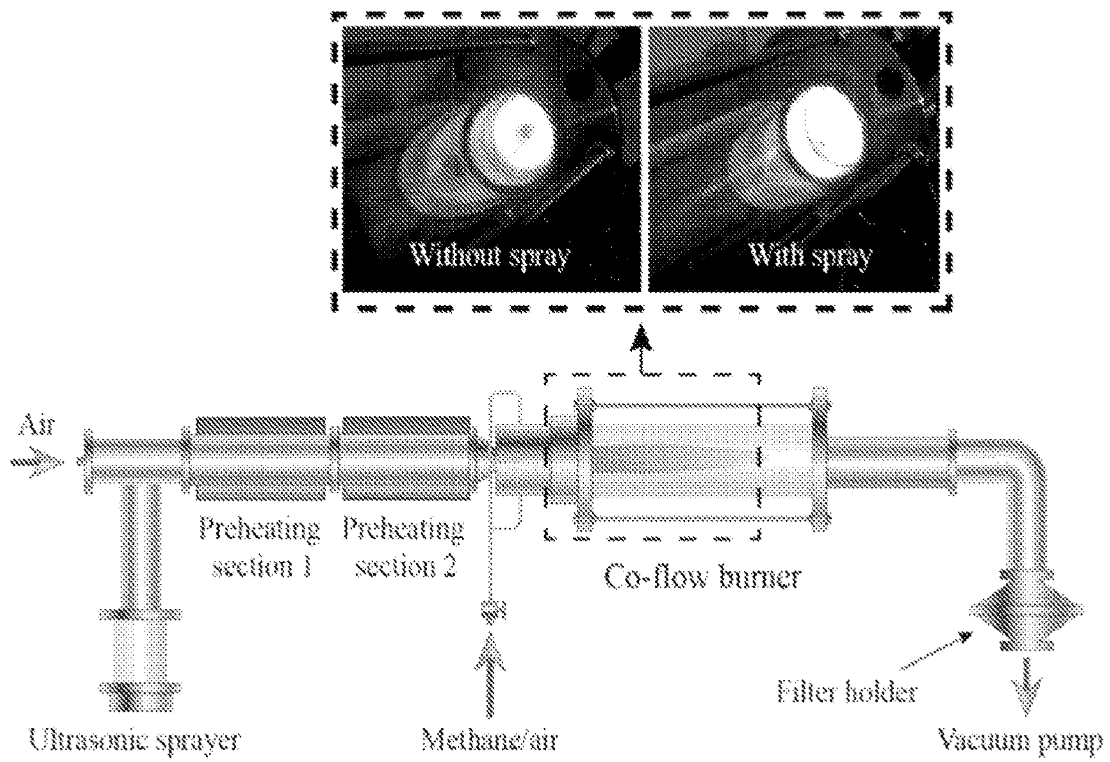
FIG. 1 is a schematic of the experiment setup.

Reference numbers in parenthesis "(Ref.)" herein refer to the corresponding literature listed in the attached Bibliography which forms a part of this Specification, and the literature is incorporated by reference herein.

A method that allows the low-cost synthesis of SC for future large-scale production is described.

Nickel-rich cathode materials are promising candidates for high energy density lithium-ion batteries. Nevertheless, nickel-rich cathode materials also encounter challenges such as low mechanical strength, fast capacity fading, and low thermal stability due to the serious structural damage after extensive cycling. An efficient way to mitigate those issues is switching from the current polycrystalline structure to single-crystal. However, traditional methods for single-crystal material synthesis require long and complex steps, causing high manufacturing costs. In order to simplify the synthesis process, the current work used a flame-assisted spray pyrolysis (FASP) method to reduce the overall time needed for preparing single-crystal cathode materials. The efforts examine the effects of the flame temperature, calcination temperature, and calcination time on the crystal structure and electrochemical performance. Results showed that the flame temperature had notable effects on the pre-calcination particles. A higher flame temperature ensured more thorough material decomposition and less agglomerated powder. Moreover, the calcination temperature and time played a dominant role in determining the crystal size, cation mixing level, and electrochemical performance. By changing the calcination temperature from 800° C. to 950° C. and varying the calcination time, the crystal size can be modified from 1 μm to 5 μm, which increases the volumetric density. Although the initial discharge capacity of the single-crystal materials slightly decreased with the increasing crystal size, the capacity retention after extensive cycling was notably improved. Overall, the single-crystal cathode materials synthesized with FASP showed promising performance when compared with other methods, implying a potential low-cost route for single-crystal nickel-rich cathode material production.

Different methods have been developed to synthesize SC cathode materials, including co-precipitation, solid-state, hydrothermal, spray pyrolysis, and molten salt (Ref. 3). Co-precipitation is adapted from the traditional method used for polycrystalline cathode materials. The advantage of co-precipitation is producing a precursor that has uniform elemental distribution and controllable size for polycrystalline secondary particles. Nevertheless, as the SC size is less dependent on the precursor size, the advantage of co-precipitation is weakened. The solid-state method usually introduces impurities and non-uniformity, whereas the hydrothermal route is usually time-consuming. The molten-salt method is a widely used method for SC synthesis, which has the advantage of reducing synthesis temperature and tuning specific facets. However, washing and post-annealing steps are needed to remove undesirable salts, adding complexity and cost (Ref. 3). In contrast, spray-based methods have advantages in fast material preparation, continuous operation, and uniform elemental distribution. Thus, they are promising for reducing manufacturing costs and ensuring the high performance of SC cathode materials.

For instance, spray pyrolysis has been used to synthesize nickel-rich $Li(Ni_{0.8}Co_{0.1}Mn_{0.1})O_2$ (NCM811) (Ref. 5) and $Li(Ni_{0.8}Co_{0.15}Al_{0.05})O_2$ (NCA) (Ref. 6). Nevertheless, all currently reported spray pyrolysis methods used for SC only produced powder without lithium; therefore, extra steps of mixing lithium sources are necessary. To further simplify the synthesis step, the current work reports a method based on flame-assisted spray pyrolysis (FASP) for synthesizing SC nickel-rich cathode materials. Different from other works, the lithium source was added directly into the precursor solution, further simplifying the synthesis procedure.

The precursor solution was prepared by dissolving lithium nitrate ($LiNO_3$), nickel nitrate hexahydrate ($Ni(NO_3)_2 \cdot 6H_2O$), manganese nitrate tetrahydrate ($Mn(NO_3)_2 \cdot 4H_2O$), and cobalt nitrate hexahydrate ($Co(NO_3)_2 \cdot 6H_2O$) in deionized water.

Excess lithium salt can be added to compensate for the lithium loss during the synthesis process. The lithium salt can be $LiNO_3$, LiOH, $Li_2SO_4$, $Li_2CO_3$, or mixtures thereof. The excess amount can be 1%, 2%, 3%, 4%, 5%, 6%, 7%, 8%, 9%, 10%, 11%, 12%, 13%, %14%, 15%, 16%, 17%, 18%, 19%, or 20% by mass.

Additives can also be used to optimize the precursor, for example, urea or polyvinylpyrrolidone.

A method of synthesis of a single crystal nickel-rich cathode material can include forming droplets of a precursor solution including a nickel salt in a stream of air, preheating the droplets, generating a flame in a burner, decomposing the droplets by passing through the burner, and calcinating the solid particles in a furnace in the presence of an oxidizing agent and, optionally, a lithium salt at a calcination temperature and for a calcination time to control the size and crystal structure of the single crystal nickel-rich cathode material. The added lithium salt can control the crystallization of the single crystal cathode materials. The lithium salt can be $LiNO_3$, LiOH, $Li_2SO_4$, $Li_2CO_3$, or mixtures thereof. The excess amount can be 1%, 2%, 3%, 4%, 5%, 6%, 7%, 8%, 9%, 10%, 11%, 12%, 13%, 14%, 15%, 16%, 17%, 18%, 19%, or 20% by mass.

Calcination is a necessary step for crystallization and grain growth to form single crystal cathode materials. The calcination temperature can be greater than 725° C., greater than 750° C., greater than 775° C., greater than 800° C., or greater than 825° C. Calcination temperatures higher than 825° C. can be preferred for fast grain growth. The calcination temperature can be less than 950° C., less than 925° C., less than 900° C., or less than 875° C. For example, the calcination temperature can be between 750° C. and 900° C. In certain circumstances, the calcination temperature can be between 800° C. and 875° C., e.g., about 850° C.

In certain circumstances, the calcination time can be between 10 minutes and 10 hours. The calcination time can be greater than 10 minutes, greater than 20 minutes, greater than 30 minutes, greater than 40 minutes, greater than 50 minutes, greater than 60 minutes, greater than 70 minutes, greater than 80 minutes, greater than 90 minutes, greater than 2 hours, greater than 3 hours, greater than 4 hours, greater than 5 hours, greater than 6 hours, greater than 7 hours, greater than 8 hours, greater than 9 hours. The calcination time can be less than 10 hours, less than 9 hours, less than 8 hours, less than 7 hours, less than 6 hours, less than 5 hours, less than 4 hours, less than 3 hours, or less than 2 hours. For example, the calcination time can be between 30 minutes and 90 minutes, e.g., about one hour. In certain circumstances, the solid particles are calcinated for up to 60 minutes at between 825° C. and 875° C.

A single crystal nickel-rich cathode material can include spherical lithium-nickel-cobalt-manganese oxide particles substantially free of hollow particles, broken particles and particles with holes on a surface of the particles.

In certain circumstances, the single crystal nickel-rich cathode material can include single crystal particles having an average size of between 0.5 microns and 5 microns. For example, the single crystal nickel-rich cathode material can include single crystal particles having an average size of between 1 microns and 3 microns. For example, by changing the calcination temperature from 800° C. to 950° C. and varying the calcination time, the crystal size can be modified from 1 microns to 5 microns.

In certain circumstances, the nickel-rich cathode material can include lithium-nickel-cobalt-manganese oxide (NCM). In certain circumstances, the nickel-rich cathode materials can include an ordered layered structure. In certain circumstances, the nickel-rich cathode materials can include $LiNi_{0.8}Co_{0.1}Mn_{0.1}O_2$(NCM811) or $LiNi_{0.6}Co_{0.2}Mn_{0.2}O_2$ (NCM822).

In certain circumstances, the nickel-rich cathode material can have a discharge capacity of greater than 175 mAh/g, greater than 180 mAh/g, greater than 181 mAh/g, greater than 182 mAh/g, greater than 183 mAh/g, greater than 184 mAh/g, greater than 185 mAh/g, greater than 186 mAh/g, greater than 187 mAh/g, greater than 188 mAh/g, greater than 189 mAh/g, greater than 190 mAh/g, greater than 191 mAh/g, greater than 192 mAh/g, or greater than 193 mAh/g (1st cycle at 0.1 C). For example, the nickel-rich cathode material can have a discharge capacity is about 198.3 mAh/g (1st cycle at 0.1 C).

In certain circumstances, the nickel-rich cathode material can have a capacity retention ratio of greater than 50%, greater than 55%, greater than 60%, greater than 65%, greater than 70%, greater than 75%, greater than 80%, greater than 85%, or greater than 90% after 50 cycles at 1 C.

In certain circumstances, the nickel-rich cathode material can have a coulombic efficiency of greater than 80%, greater than 85%, greater than 90%, or greater than 95%.

A method of synthesis of nickel-rich cathode material can include forming droplets of a precursor solution including a nickel salt in a stream of air, preheating the droplets, generating a flame in a burner, decomposing the droplets by passing through the burner, and collecting solid particles on a powder collector. The burner can be a co-flow burner. The decomposing can take place in an inner tube of the co-flow burner.

In certain circumstances, preheating the droplets can include tuning the morphology and electrochemical performance of the nickel-rich cathode material by adjusting a preheating temperature and preheating time. The preheating time can be controlled by adjusting the flow rate of gas passing through a preheating zone. For example, the droplets can be passed through a preheating zone at a flow rate of greater than 5 L/min, greater than 7 L/min, or greater than 10 L/min, less than 20 L/min, or less than 15 L/min. For example, the flow rate can be between 5 L/min and 20 L/min. In certain circumstance, the flow rate can be about 10 L/min. The preheating temperature can be less than 375° C., less than 350° C., less than 325° C., less than 300° C., less than 275° C., less than 250° C., or less than 225° C. The preheating temperature can be greater than 75° C., greater than 100° C., greater than 125° C., greater than 150° C., greater than 175° C., or greater than 200° C. For example, the preheating temperature can be between 125° C. and 325° C.

In certain circumstances, a method of synthesis of nickel-rich cathode materials can include preparing a precursor solution by dissolving lithium nitrate, nickel nitrate, manganese nitrate, and cobalt nitrate in water. The water can be deionized water. For example, a precursor solution can be prepared by dissolving lithium nitrate ($LiNO_3$), nickel nitrate hexahydrate ($Ni(NO_3)_2 \cdot 6H_2O$), manganese nitrate tetrahydrate ($Mn(NO_3)_2 \cdot 4H_2O$), and cobalt nitrate hexahydrate ($Co(NO_3)_2 \cdot 6H_2O$) in deionized water.

In certain circumstances, excess lithium salt can be added to compensate for the lithium loss during the synthesis process. The lithium salt can be $LiNO_3$, LiOH, $Li_2SO_4$, $Li_2CO_3$, or mixtures thereof. The excess lithium salt can be 2%, 3%, 4%, 5%, 6%, 7%, 8%, 9%, 10%, 11%, 12%, 13%, 14%, 15%, 16%, 17%, 18%, 19% or 20% excess of the mass of the final composition stoichiometry.

Other additives can be used to optimize the precursor solution performance. For example, a nitrogen-containing species can be added to the precursor solution. The nitrogen-containing species can be a compound including an amide group or urea group. For example, the additive can be urea or polyvinylpyrrolidone. In certain circumstances, the precursor solution can include 0.5 wt %, 1.5 wt %, 1.0 wt %, 1.5 wt %, 2.0 wt %, 2.5 wt %, 3.0 wt %, 3.5 wt %, or 4.0 wt % of the additive. The additive can help control the droplet evaporation and decomposition process.

The schematic of the experimental setup is shown in FIG. 1. The main components of the material synthesis system are a 1.7 MHz homemade ultrasonic sprayer, two low-temperature preheating sections, a co-flow burner, and a filter powder collector. Droplets from the sprayer were carried to the low-temperature preheating zones by air at a constant flow rate of 10 L/min. Then, the partially dried particles entered the co-flow burner for decomposition, and the burner used premixed methane and air. The inserted photos show two different burner conditions with and without the precursor spray. Solid particles were generated after passing through the flame and were subsequently deposited on a glass fiber filter.

Figure 2:
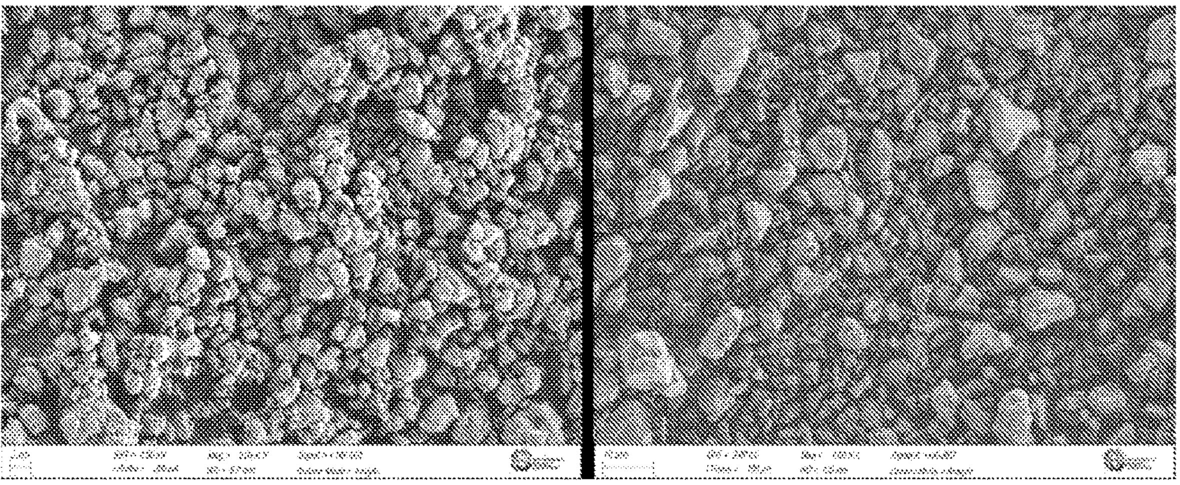
FIG. 2 are scanning electron microscopy (SEM) images of SC cathode materials with different particle sizes.
Figure 3:
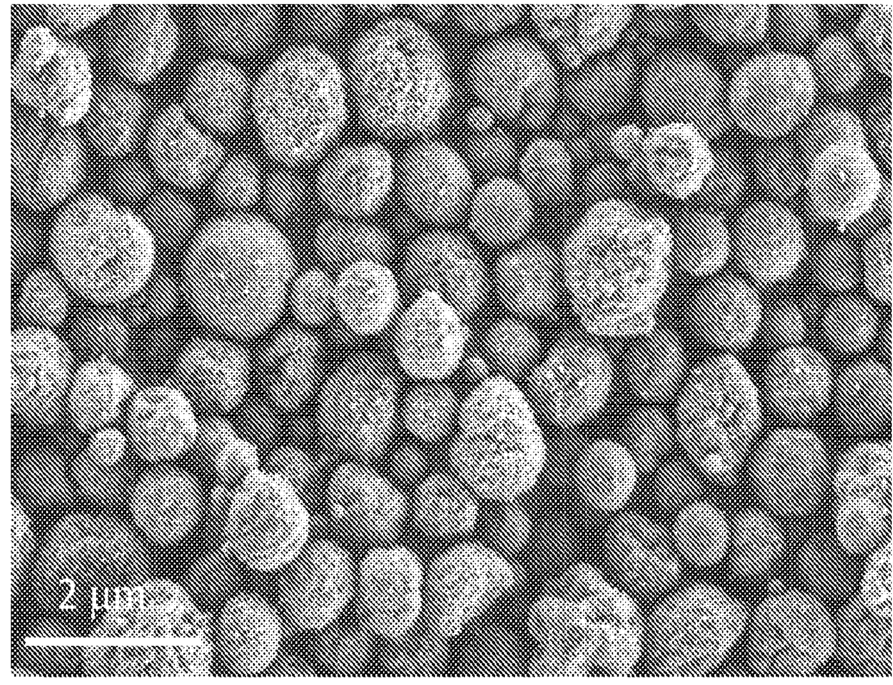
FIG. 3 is an SEM image of as-synthesized particles.

The collected powder was then calcinated in a tube furnace for different temperatures and times with an oxygen flow of 0.25 L/min. By controlling the calcination time and temperature, SC cathode materials can be synthesized with controllable size (FIG. 2) and desired crystal structure.

The FASP method disclosed herein is a promising candidate for SC cathode material production due to the continuous flow condition and simple operation system. The method disclosed herein has the potential for large scale production considering the successful application of flame spray pyrolysis (FSP) in commercially producing $TiO_2$ and carbon black at the rate of tons per hour (Ref. 4). Moreover, based on the great advantage of the method disclosed herein in simplifying the synthesis process and reducing the cost, the method disclosed herein has a great potential in promoting low-cost LIBs.

EXAMPLES

Solution Preparation

The precursor solution was prepared by dissolving lithium nitrate ($LiNO_3$), nickel nitrate hexahydrate ($Ni(NO_3)_2 \cdot 6H_2O$), manganese nitrate tetrahydrate ($Mn(NO_3)_2 \cdot 4H_2O$), and cobalt nitrate hexahydrate ($Co(NO_3)_2 \cdot 6H_2O$) in deionized water at a molar ratio of Li:Ni:Mn:Co=1.1:0.8:0.1:0.1. The total metal salt concentration was 2 mol/L. 10% excess $LiNO_3$ was added to compensate for the lithium loss during the synthesis process. Urea was introduced as an additive.

Material Synthesis Process

The schematic of the experimental setup is shown in FIG. 1. The main components of the material synthesis system are a 1.7 MHz homemade ultrasonic sprayer, two low-temperature preheating sections, a co-flow burner, and a filter powder collector. During the test, the spray droplets were carried through the low-temperature preheating zones by air at a constant flow rate of 10 L/min. Then, the partially dried particles entered the co-flow burner for decomposition. The burner used premixed methane/air at a constant equivalence ratio of 0.65 and a flow rate of 16 L/min. The insert photos show the difference between the flames with and without spray. After passing the burner, solid particles were generated and collected by a glass fiber filter. The collected powder was then calcinated in a tube furnace for different temperatures and times with an oxygen flow of 0.25 L/min. The calcinated power was grounded for material characterization and electrochemical testing.

Characterization Methods

X-ray diffraction (XRD) was conducted to examine the crystal structure with a PANalytical X'Pert PRO X-ray diffractometer using monochromatic, nickel filtered Cu Kα radiation ($K_{\alpha 1}$=1.540598 Å and $K_{\alpha 2}$=1.544426 Å) in the 20 range of 10-700 with a step size of 0.01° $s^{-1}$. The XRD data were analyzed using HighScore Plus software. Scanning electron microscopy (SEM) was performed on a Zeiss Merlin high-resolution scanning electron microscope.

Electrochemical Test

The cathode electrode was fabricated by first mixing the active material, carbon black, and polyvinylidene fluoride (PVDF) binder at a weight ratio of 8:1:1. The slurry was then pasted on an aluminum film with an active material loading of 3 mg/$cm^2$. The coated film was dried in a vacuum oven at 100° C. for 24 hours. Then, the cathode electrode disks were punched out and pressed in a glovebox, in which CR2032-type half-cells were assembled with the prepared cathode electrode, a Li metal disk as the anode, a separator (Celgard 2320), and a commercial electrolyte made with 1 M $LiPF_6$ in a mixture of ethylene carbonate (EC) and diethyl carbonate (DEC) (EC:DEC=1:1 v/v). A Land CT3001A 8-channel battery tester was used for galvanostatic charge-discharge study at different current rates (1C=200 mA/g) in the potential range of 3-4.3 V.

Results and Discussion

Figure 4:
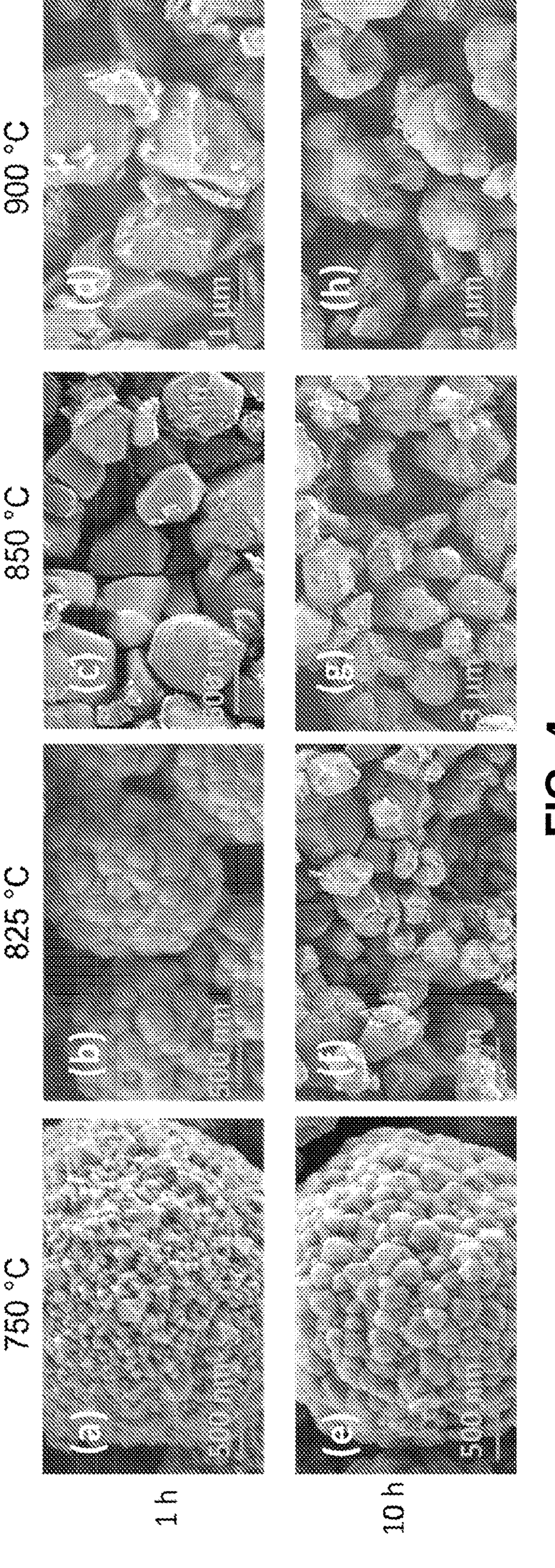
FIG. 4 is a series of SEM images of samples calcinated at 750° C. for (panel a) 1 h and (panel e) 10 h; 825° C. for (panel b) 1 h and (panel f) 10 h; 850° C. for (panel c) 1 h and (panel g) 10 h; and 900° C. for (panel d) 1 h and (panel h) 10 h.

The as-synthesized particles are shown in FIG. 4. The majority of particles are 1-2 μm and spherical. Because the as-synthesized particles are not fully crystallized, calcination is a necessary step for crystallization and grain growth to form SC cathode materials. Both calcination temperature and time are essential factors determining the size and morphology of the calcinated particle. In the current study, calcination temperatures of 750° C., 825° C., 850° C., and 900° C. were used. For each temperature, calcination times of 1 h and 10 h were applied. At a low temperature of 750° C., the calcinated particle in FIG. 4, panel (a), still maintains its spherical shape with agglomerated nanoscale primary particles. Even with the time increased to 10 h, FIG. 4, panel (e), shows the particle is still spherical but with enlarged primary particles less than 500 nm. Then, the temperature increased to 825° C. Although particles are still spherical when the time is 1 h, primary particles in FIG. 4, panel (b), are even larger than that of the sample with a temperature of 750° C. and time of 10 h, indicating faster grain growth with the higher temperature. Neck growth is also noticed in FIG. 4, panel (b), for adjacent particles, indicating grain growth at the temperature of 825° C. Interestingly, dispersed SC particles with a size around 1 μm are noticed in FIG. 4, panel (f), when the time is extended to 10 h. As the temperature increased to 850° C., dispersed SC particles were observed in FIG. 4, panel (c), even with a short time of 1 h. With the increased time of 10 h, the calcinated SC particles shown in FIG. 4, panel (g), can reach a size around 2-3 μm. When a temperature of 900° C. was used, FIG. 4, panel (d), shows approximately 1 μm SC particles even with the calcination time of 1 h. Nevertheless, agglomerated large particles are noticed in FIG. 4, panel (h), once time increases to 10 h. Overall, a low temperature of 750° C. is insufficient for grain growth and forming dispersed particles. Temperatures higher than 825° C. are preferred for fast grain growth. Nevertheless, the calcination time needs to be carefully controlled to avoid agglomeration.

Figure 5A:
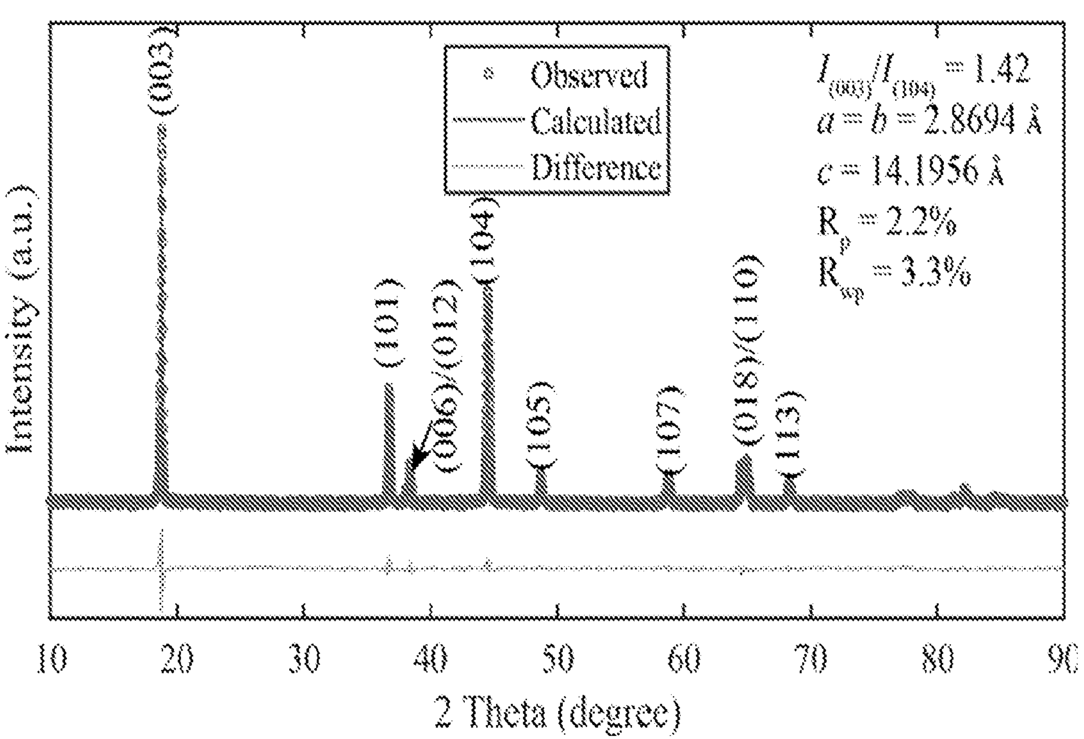
FIGS. 5A-5B are graphs depicting observed and calculated XRD patterns of (FIG. 5A) 850° C., 1 h and (FIG. 5B) 850° C., 10 h.
Figure 5B:
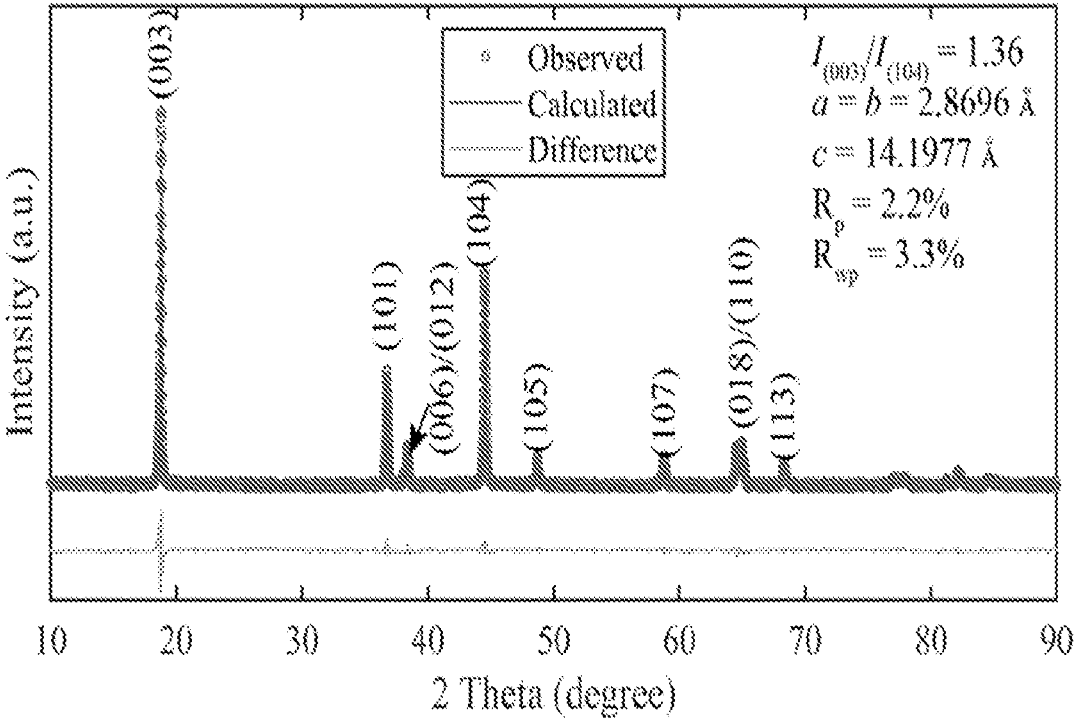

Among all cases, samples calcinated at 850° C. have well-dispersed particles in both short and long calcination steps, indicating this temperature is preferred for controlling SC size. Therefore, two samples calcinated at 850° C. were characterized further. XRD patterns show that the diffraction peaks of all annealed samples are clearly identified and can be indexed based on the hexagonal α-$NaFeO_2$ type, defining a metal oxide layered structure with an $R\bar{3}m$ space group with no impurity phases (Ref. 7). Both XRD patterns have clearly split pairs of (006)/(012) and (018)/(110), indicating an ordered layered structure. The results are further confirmed with the structure parameters calculated by Rietveld refinement that are shown in FIGS. 5A-5B. The ratios of c/a of both samples are higher than 4.94, indicating well-developed $R\bar{3}m$ structure (Ref. 8). Moreover, the intensity ratio of $I_{(003)}/I_{(104)}$ is a good indicator of the level of cation mixing. Both samples have a $I_{(003)}/I_{(104)}$ value higher than 1.2, implying a low level of cation mixing (Ref. 9).

Figure 6A:
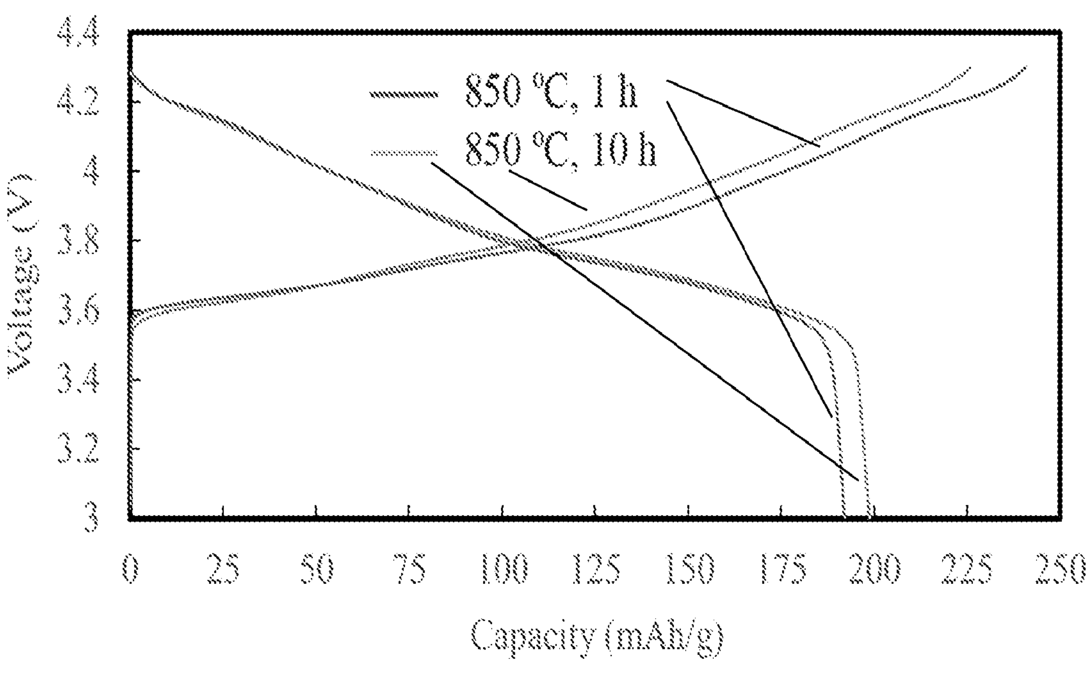
FIGS. 6A-6B are graphs depicting (FIG. 6A) first cycle charge/discharge profiles in the potential range of 3-4.3V and (FIG. 6B) cycling performance at 1C of samples calcinated at 850° C. with the time of 1 h and 10 h.
Figure 6B:
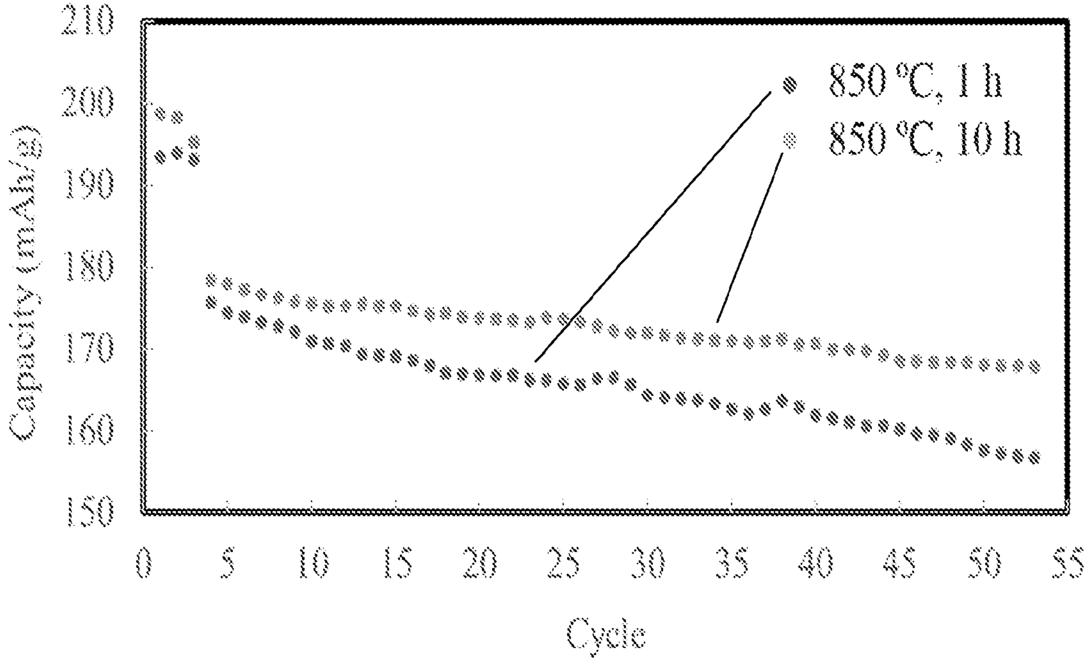

The electrochemical performance of samples calcinated at 850° C. are illustrated in FIGS. 6A-6B. The first cycle discharge capacity is 193.4 mAh/g and 198.7 mAh/g for samples with the time of 1 h and 10 h, respectively. Moreover, the Coulombic efficiency also increases from 80.28% to 87.97% when the time is extended from 1 h to 10 h. Besides the improved the first cycle performance, the cycling performance is also enhanced by increasing the calcination time. After 50 cycles at 1C, the capacity retention is 89.3% and 94.1% for cases with 1 h and 10 h, respectively. Electrochemical tests have clearly demonstrated that extending the calcination time has enhanced the performance. This is largely benefited from the increasing particle size shown in FIG. 4. As the SC size increases, the surface area decreases and reduces the side reaction between the cathode material and the electrolyte, resulting in better cycling performance.

As described herein, a flame-assisted spray pyrolysis method can be used to synthesize SC NCM811 cathode materials. Both calcination temperature and time play critical roles in producing SC with controllable size and less agglomerated structure. Too low of a temperature will only result in polycrystalline particles, whereas a high temperature with a long calcination time can cause serious agglomeration. With the current FASP synthesized powder, the temperature of 850° C. is preferred for synthesizing micron-size SC particles. Overall, extending the calcination time from 1 h to 10 h prompted grain growth without damaging the ordered layered structure. Moreover, the sample with 10 h calcination at 850° C. shows better electrochemical performance than that with 1 h calcination. The current study demonstrated the great potential of using FASP for producing SC nickel-rich cathode materials, which could be a low-cost route for large-scale production.

BIBLIOGRAPHY

[1]J. Kim, H. Lee, H. Cha, M. Yoon, M. Park, J. Cho. Prospect and Reality of Ni-Rich Cathode for Commercialization. *Adv Energy Mater* (2018); 8:1702028.

[2]Y. Wang, E. Wang, X. Zhang, H. Yu. High-Voltage "Single-Crystal" Cathode Materials for Lithium-Ion Batteries. *Energy & Fuels* (2021); 35:1918-32.

[3]J. Langdon, A. Manthiram. A perspective on single-crystal layered oxide cathodes for lithium-ion batteries. *Energy Storage Mater* (2021); 37:143-60.

[4]S. Li, Y. Ren, P. Biswas, S. D. Tse. Flame aerosol synthesis of nanostructured materials and functional devices: Processing, modeling, and diagnostics. *Prog Energy Combust Sci* (2016); 55:1-59.

[5]J. Zhu, J. Zheng, G. Cao, Y. Li, Y. Zhou, S. Deng, et al. Flux-free synthesis of single-crystal $LiNi_{0.8}Co_{0.1}Mn_{0.1}O_2$ boosts its electrochemical performance in lithium batteries. *J Power Sources* (2020); 464:228207.

[6]J. Leng, J. Wang, W. Peng, Z. Tang, S. Xu, Y. Liu, et al. Highly-Dispersed Submicrometer Single-Crystal Nickel-Rich Layered Cathode: Spray Synthesis and Accelerated Lithium-Ion Transport. *Small* (2021); 17:2006869

[7]X. Xu, H. Huo, J. Jian, L. Wang, H. Zhu, S. Xu, et al. Radially Oriented Single-Crystal Primary Nanosheets Enable Ultrahigh Rate and Cycling Properties of $LiNi_{0.8}Co_{0.1}Mn_{0.1}O_2$ Cathode Material for Lithium-Ion Batteries. *Adv Energy Mater* (2019); 9:1803963.

[8]Z. Feng, R. Rajagopalan, S. Zhang, D. Sun, Y. Tang, Y. Ren, et al. A Three in One Strategy to Achieve Zirconium Doping, Boron Doping, and Interfacial Coating for Stable $LiNi_{0.8}Co_{0.1}Mn_{0.1}O_2$ Cathode. *Adv Sci* (2021); 8:2001809.

[9]J. Zhang, S. Xu, KI Hamad, A M Jasim, Y. Xing. High retention rate NCA cathode powders from spray drying and flame assisted spray pyrolysis using glycerol as the solvent. *Powder Technol* (2020); 363:1-6.

Details of one or more embodiments are set forth in the accompanying drawings and description. Other features, objects, and advantages will be apparent from the description, drawings, and claims. Although a number of embodiments of the invention have been described, it will be understood that various modifications may be made without departing from the spirit and scope of the invention. It should also be understood that the appended drawings are not necessarily to scale, presenting a somewhat simplified representation of various features and basic principles of the invention.

What is claimed is:

1. A method of synthesis of a single crystal nickel-rich cathode material comprising:

a) forming droplets of a precursor solution comprising a nickel salt in a stream of air;
b) preheating the droplets;
c) generating a flame in a burner;
d) decomposing the droplets by passing them through the burner; and
e) calcinating the solid particles in a furnace in the presence of an oxidizing agent at a calcination temperature and for a calcination time to control the size and crystal structure of the single crystal nickel-rich cathode material, wherein preheating the droplets comprises exposing the droplets to a temperature of 125° C. to 325° C.

2. The method of claim 1, wherein the calcination temperature is between 750° C. and 900° C. and the calcination time is between 10 minutes and 2 hours.

3. The method of claim 1, wherein the single crystal nickel-rich cathode material comprises single crystal particles having an average size of between 0.5 microns and 5 microns.

4. The method of claim 1, wherein the precursor solution comprises urea.

5. The method of claim 1, wherein the nickel-rich cathode material comprises lithium-nickel-cobalt-manganese oxide (NCM).

6. The method of claim 1, wherein the droplets are passed through a preheating zone at a flow rate of between 5 L/min and 20 L/min.

7. The method of claim 1, wherein the solid particles are calcinated for up to 60 minutes at between 825° C. and 875° C.

8. The method of claim 1, wherein the precursor solution is prepared by dissolving lithium nitrate, nickel nitrate, manganese nitrate, and cobalt nitrate in water.

9. The method of claim 1, further comprising adding excess lithium salt to the precursor solution, wherein the excess lithium salt is between 2% and 20% excess of the mass of the final composition stoichiometry.

10. The method of claim 1, wherein the droplets are formed by aerosolizing the precursor solution using an ultrasonic sprayer.

11. The method of claim 1, wherein the method is a continuous-flow process.

12. The method of claim 1, further comprising depositing the solid particles on a glass-fiber filter after decomposing the droplets.

13. A method of synthesis of a single crystal nickel-rich cathode material comprising:

a) preparing a precursor solution by dissolving lithium nitrate, nickel nitrate, manganese nitrate, and cobalt nitrate in water;
b) aerosolizing the precursor solution in a stream of air using an ultrasonic sprayer to form droplets;
c) preheating the droplets;
d) generating a premixed methane flame in a burner;

e) decomposing the droplets by passing them through the burner;

f) depositing solid particles on a powder collector; and g) calcinating the solid particles in a furnace in the presence of an oxidizing agent to produce a single crystal cathode material of a controllable size and crystal structure by controlling the calcination time and calcination temperature, wherein preheating the droplets comprises exposing the droplets to a temperature of 125° C. to 325° C.

14. The method of claim 13, wherein the precursor solution comprises urea.

15. The method of claim 13, wherein the nickel-rich cathode material comprises lithium-nickel-cobalt-manganese oxide (NCM).

16. The method of claim 13, wherein the nickel nitrate of the precursor solution is nickel nitrate hexahydrate ($Ni(NO_3)_2 \cdot 6H_2O$).

17. The method of claim 13, wherein the manganese nitrate of the precursor solution is manganese nitrate tetrahydrate ($Mn(NO_3)_2 \cdot 4H_2O$).

18. The method of claim 13, wherein the cobalt nitrate of the precursor solution is cobalt nitrate hexahydrate ($Co(NO_3)_2 \cdot 6H_2O$).

19. The method of claim 13, comprising a liquid-feed flame assisted spray pyrolysis (FASP) method.

* * * * *